(12) United States Patent
Inoue et al.

(10) Patent No.: US 9,977,092 B2
(45) Date of Patent: May 22, 2018

(54) VOLTAGE MONITORING DEVICE

(71) Applicant: DENSO CORPORATION, Kariya, Aichi-pref. (JP)

(72) Inventors: Masahiro Inoue, Obu (JP); Hayato Mizoguchi, Takahama (JP); Takeshi Iida, Obu (JP); Hiroki Kobayashi, Hamamatsu (JP)

(73) Assignee: DENSO CORPORATION, Kariya (JP)

( * ) Notice: Subject to any disclaimer, the term of this patent is extended or adjusted under 35 U.S.C. 154(b) by 207 days.

(21) Appl. No.: 14/744,414

(22) Filed: Jun. 19, 2015

(65) Prior Publication Data

US 2015/0377973 A1 Dec. 31, 2015

(30) Foreign Application Priority Data

Jun. 27, 2014 (JP) .................................. 2014-132057

(51) Int. Cl.

| G01N 27/416 | (2006.01) |
|---|---|
| G01R 31/36 | (2006.01) |
| G01R 35/00 | (2006.01) |
| G01R 19/165 | (2006.01) |
| G01R 31/02 | (2006.01) |

(52) U.S. Cl.
CPC ... *G01R 31/3658* (2013.01); *G01R 19/16542* (2013.01); *G01R 35/00* (2013.01); *G01R 31/02* (2013.01)

(58) Field of Classification Search
CPC .................................................. G01R 31/3658
USPC ........................................................ 324/426
See application file for complete search history.

(56) References Cited

U.S. PATENT DOCUMENTS

| 9,553,462 B2 * | 1/2017 | Song ..................... H02J 7/0034 |
|---|---|---|
| 2013/0057294 A1 | 3/2013 | Mizoguchi et al. |
| 2014/0097852 A1 | 4/2014 | Mizoguchi |

FOREIGN PATENT DOCUMENTS

| JP | 2008-079415 A | 4/2008 | |
|---|---|---|---|
| JP | 2008-319991 | * 7/2010 | ............. G01R 19/00 |
| JP | 2010-145128 A | 7/2010 | |
| JP | 2013-053939 A | 3/2013 | |
| JP | 2014-059211 A | 4/2014 | |
| JP | 2014-077656 A | 5/2014 | |

* cited by examiner

*Primary Examiner* — Edward Tso
*Assistant Examiner* — Ahmed Omar
(74) *Attorney, Agent, or Firm* — Oliff PLC

(57) ABSTRACT

A voltage monitoring device has a capacitor circuit having capacitors connected in series, first switches connecting end terminals of the capacitor circuit to specific electrode terminals of unit cells in a battery pack, second switches connecting remaining electrode terminals of the unit cells to the connection nodes between the capacitors, first voltage detection sections corresponding to each of the capacitors, a second voltage detection section connected to the end terminals of the capacitor circuit, and a microcomputer which selectively performs a first process of charging each capacitor, and a second process of charging the capacitors simultaneously. The respective specific electrode terminals correspond to the unit cells, and are arranged at an interval corresponding to the number of connection nodes formed between the capacitors. The microcomputer performs a polarity switching process of adjusting for the adjacent capacitors to have a same polarity of the charged voltage before performing the second process.

9 Claims, 3 Drawing Sheets

VOLTAGE MONITORING DEVICE

CROSS-REFERENCE TO RELATED APPLICATION

This application is related to and claims priority from Japanese Patent Application No. 2014-132057 filed on Jun. 27, 2014, the contents of which are hereby incorporated by reference.

BACKGROUND OF THE INVENTION

1. Field of the Invention

The present invention relates to voltage monitoring devices applied to battery packs having a plurality of unit cells connected in series, in particular, flying capacitor type voltage monitoring devices capable of monitoring and detecting a voltage of each of unit cells forming a battery pack by using a plurality of capacitors.

2. Description of the Related Art

There have been known and used a flying capacitor type voltage monitoring devices capable of monitoring a voltage of unit cells forming a battery pack by using capacitors. The unit cells are connected in series together in the battery pack. Such a flying capacitor type voltage monitoring device has a voltage detection circuit capable of detecting a voltage of each unit cell in the battery pack on the basis of a charged voltage of the capacitor. The voltage detection circuit is connected to the capacitor, and detects whether or not a line disconnection occurs.

There has been proposed a double flying capacitor type voltage monitoring device, which is different in structure from the flying capacitor type voltage monitoring device previously described. The double flying capacitor type voltage monitoring device detects a voltage of each of unit cells by using two capacitors, where the unit cells belong to two battery groups. In the structure of the double flying capacitor type voltage monitoring device, respective first voltage detection circuits are connected to the two capacitors, in order to detect a charged voltage of each of the two battery groups.

There is a parent document 1, Japanese patent laid open publication No. JP 2014-77656, which discloses such a double flying capacitor type voltage monitoring device equipped with a first voltage detection circuit and a second voltage detection device. The second voltage detection device is connected commonly to the two capacitors. In this structure, the first voltage detection circuit detects a charged voltage of each of the two capacitors, and the second voltage detection circuit detects a total charged voltage of the two capacitors. This structure reduces the number of switches (i.e. detection lines) through which the capacitors are connected to both ends of the unit cell group having the unit cells connected in series. As a result, the patent document 1 provides the voltage monitoring device having a simple structure.

However, the voltage monitoring circuit disclosed in the patent document 1 performs both a first process and a second process. The first process charges each of the capacitors, respectively. The second process collectively charges the capacitors connected in series. This introduces a possible problem of performing the second process due to a state in which the charged voltage of each of the capacitors connected in series has a different polarity due to the execution of the first process. This causes a possible problem of generating variation in the charged voltage between the capacitors.

There is another possible problem in which some of the capacitors have a charged voltage which is higher than that of the remaining capacitors due to the variation of the charged voltage between the capacitors. In order to avoid this problem, it is necessary for each of the capacitors to have a withstand voltage higher than the voltage of the unit cell. This increases the overall size of the flying capacitor type voltage monitoring device.

SUMMARY

It is therefore desired to provide a voltage monitoring device, equipped with capacitors connected in series, capable of suppressing variation in charged voltage between the capacitors connected in series, and correctly detecting a voltage of each unit cell in a battery pack with high accuracy without increasing the overall size of the voltage monitoring device.

An exemplary embodiment provides a voltage monitoring device capable of monitoring a voltage of each of unit cells in a battery pack on a basis of detection results of first voltage detection sections and a second voltage detection section. The unit cells form the battery pack. The voltage monitoring device has a capacitor circuit, a plurality of first switches, a plurality of second switches, the first voltage detection sections, the second voltage detection section, a charging control section, and a polarity switching section. The capacitor circuit has a plurality of capacitors connected in series. The first switches connect both end terminals of the capacitor circuit having the capacitors connected in series to specific electrode terminals to respective unit cells in the battery pack. The specific electrode terminals correspond to respective unit cells arranged at intervals, corresponding to the number of connection nodes between the capacitors. The second switches connect remaining electrode terminals of the unit cells, other than the specific electrode terminals of the unit cells, to the connection ends of the connection nodes between the capacitors connected in series. The first voltage detection sections correspond to each of the capacitors connected in series. The second voltage detection section is connected to the end terminals of the capacitor circuit. The charging control section selectively performs a first process and a second process. The first process charges each of the capacitors through the first switches and the second switches. The second process disconnects the second switches and charges the capacitors simultaneously through the first switches. The polarity switching section is capable of adjusting the capacitors arranged adjacent to each other to have a same polarity of the charged voltages before performing the second process.

In the voltage monitoring device previously described, when two capacitors arranged adjacent to each other have different polarities, the polarity switching section provides the two capacitors adjacent to each other have the charged voltage of the same polarity before performing the second process (which simultaneously charges the overall capacitors). This makes it possible to correctly perform the second process in the state in which the charged voltages of the capacitors have the same polarity, and suppress variation in charged voltage between the capacitors.

BRIEF DESCRIPTION OF THE DRAWINGS

A preferred, non-limiting embodiment of the present invention will be described by way of example with reference to the accompanying drawings, in which.

DETAILED DESCRIPTION OF THE PREFERRED EMBODIMENTS

Figure 1:
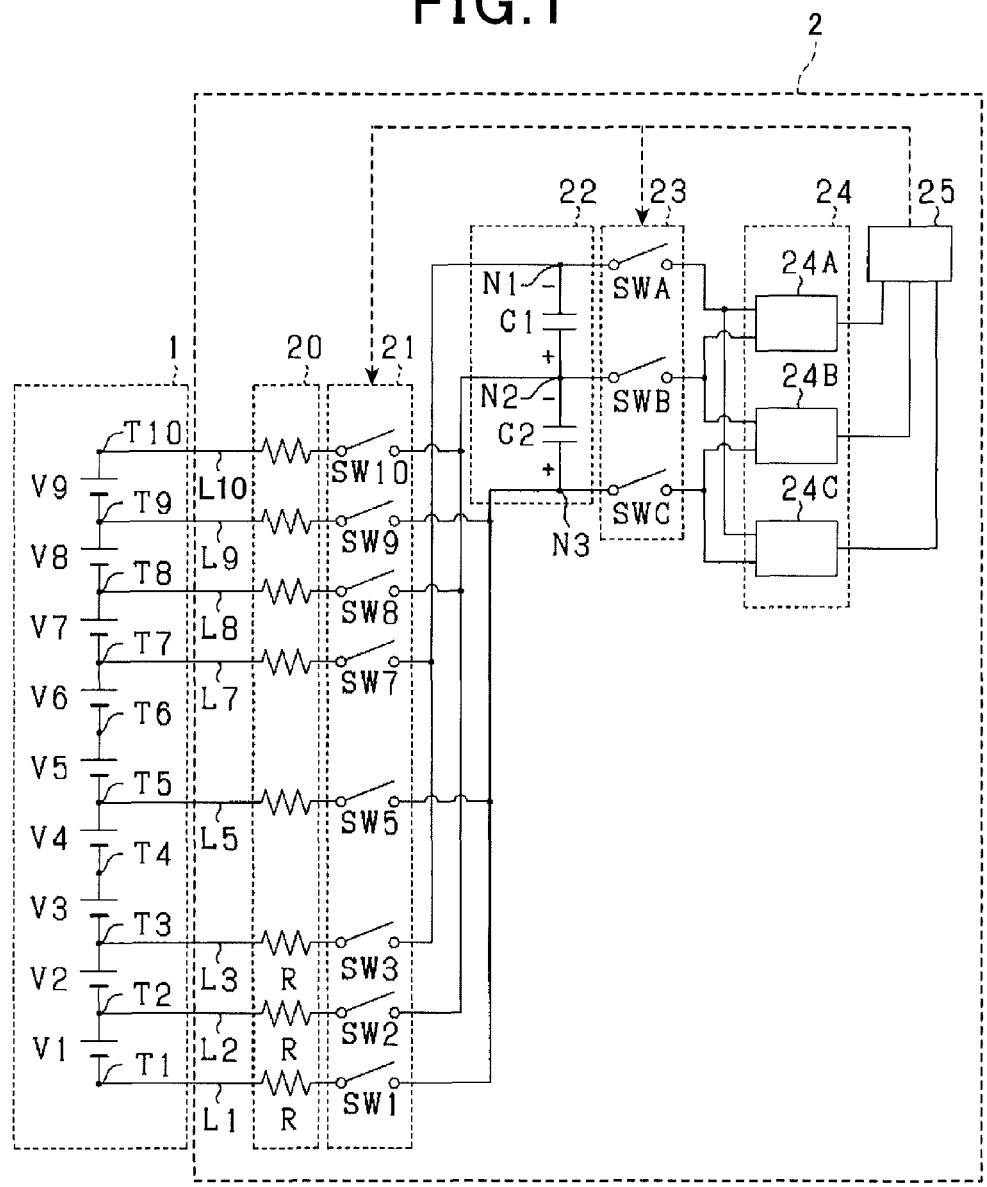
FIG. 1 is a view showing a schematic structure of a monitoring system equipped with a battery pack having unit cells and a voltage monitoring device according to an exemplary embodiment of the present invention.

Hereinafter, various embodiments of the present invention will be described with reference to the accompanying drawings. In the following description of the various embodiments, like reference characters or numerals designate like or equivalent component parts throughout the several diagrams.

Exemplary Embodiment

A description will be given of a voltage monitoring device 2 according to an exemplary embodiment with reference to FIG. 1, FIG. 2 and FIG. 3A to FIG. 3D.

FIG. 1 is a views showing a schematic structure of a monitoring system having the voltage monitoring device 2 according to the exemplary embodiment. As shown in FIG. 1, the monitoring system is equipped with a battery pack 1 and the voltage monitoring device 2 of a flying capacitor type.

The battery pack 1 supplies electric power to an electric motor (as a driving motor) through an inverter, etc. The battery pack 1 is composed of n unit cells connected in series. FIG. 1 shows a structure having the unit cells V1 to V9 connected in series to form the battery pack 1. That is, the battery pack 1 has the unit cells V1 to V9 connected in series. Each of the unit cells is a battery cell or a connection assembly of battery cells connected in series. A lithium ion rechargeable battery or a lead rechargeable battery is used as each of the battery cells.

Figure 2:
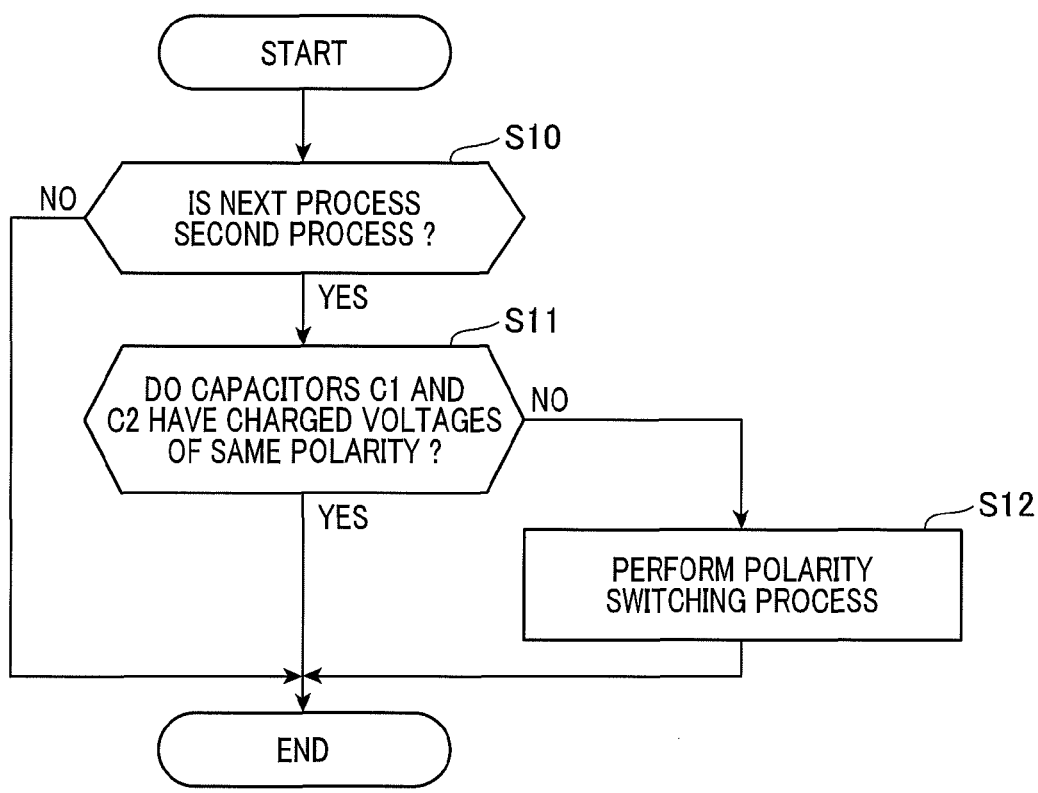
FIG. 2 is a view showing a flow chart of a process performed by the voltage monitoring device according to the exemplary embodiment shown in FIG. 1.

In the structure of the monitoring system shown in FIG. 2, the unit cells V1 to V9 have electrode terminals T1 to T10. The electrode terminal T1 is an end terminal of the battery cell V1. The electrode terminal T2 is a connection node between the unit cells V1 and V2. The electrode terminal T3 is a connection node between the unit cells V2 and V3. The electrode terminal T4 is a connection node between the unit cells V3 and V4. The electrode terminal T5 is a connection node between the unit cells V4 and V5. The electrode terminal T6 is a connection node between the unit cells V5 and V6. The electrode terminal T7 is a connection node between the unit cells V6 and V7. The electrode terminal T8 is a connection node between the unit cells V7 and V8. The electrode terminal T9 is a connection node between the unit cells V8 and V9. The electrode terminal T10 is an end terminal of the unit cell V9.

In particular, as clearly shown in FIG. 1, the electrode terminals Tm (m=1, 2, 3, 5, 7, 8, 9 and 10) are electrically connected to the battery pack 1 through detection lines Lm (m=1, 2, 3, 5, 7, 8, 9 and 10).

The voltage monitoring device 2 according to the exemplary embodiment is equipped with a resistance circuit 20, a detection line switching section 21, a capacitor circuit 22, a sampling switch section 23, a voltage detection section 24, and a microcomputer 25.

The resistance circuit 20 is equipped with a plurality of current limiting resistances R. The respective current limiting resistances R are arranged corresponding to the detection lines Lm (m=1, 2, 3, 5, 7, 8, 9 and 10) between the battery pack 1 having the unit cells and the detection line switching section 21.

The current limiting resistances R protect the battery pack 1 (at a high voltage side) and the voltage monitoring device 2 (at a low voltage side) in the monitoring system.

The detection line switching section 21 is equipped with a plurality of switches SVm (m: 1 to 3, 5 and 7 to 10). The respective switches SVm correspond to the detection lines Lm (m: 1 to 3, 5 and 7 to 10). These switches SWm switch a connection state between a connection node adjacent between the adjacent unit cells V1 to V9 and the capacitor circuit 22.

The capacitor circuit 22 is composed of a plurality of capacitors. FIG. 1 shows a pair of capacitors C1 and C2. The capacitors C1 and C2 are connected in series. Connection terminals N1 and N3 are formed at both ends of the capacitors C1 and C2 connected in series. A connection terminal is formed at a connection node between the capacitor C1 and the capacitor C2. Each of these connection terminals N1, N2 and N3 is connected to one of the switches SWm of the detection line switching section 21.

In more detail, the connection terminal N1 is connected to the [4n−1]-th switches SW3 and SW7 (n is a positive integer) in the detection line switching section 21. The connection terminal N3 is connected to the [4n−3]-th switches SW1, SW5 and SW9 in the detection line switching section 21. The connection terminal N2 is connected to the [2n]-th switches SW2, SW8 and SW10 in the detection line switching section 21. In the exemplary embodiment shown in FIG. 1, the switches connected to the electrode terminals T4 and T6 are omitted. This provides a simple structure.

A first switch corresponds to the [4n−1]-th switch and the [4n−3]-th switch which are connected to the connection terminals N1 and N3. Similarly, a second switch corresponds to the [2n]-th switches which are connected to the connection terminal N2.

The sampling switch section 23 has a plurality of switches SWA, SWB and SWC connected to the connection nodes N1, N3 and N2 in the capacitor circuit 22, respectively. In more detail, the switch SWA is connected to the connection terminal N1, the switch SWB is connected to the connection terminal N2, and the switch SWC is connected to the connection terminal N3. The connection and disconnection of these switches SWA, SWB and SWC performs the connection and disconnection between the capacitor circuit 22 and the voltage detection section 24.

The voltage detection section 24 has a plurality of voltage detection circuits 24A, 24B and 24C capable of detecting a voltage of each of the capacitors C1 and C2. The voltage detection circuit 24A is connected to the switches SWA and SWB in order to detect a voltage of the capacitor C1. The voltage detection circuit 24B is connected to the switches SWB and SWC in order to detect a voltage of the capacitor C2. The voltage detection circuit 24C is connected to the switch SWA and the switch SWC in order to detect a total voltage of the capacitors C1 and C2.

First voltage detection sections correspond to the voltage detection circuit 24A and the voltage detection circuit 24B connected to the capacitors C1 and C2, respectively. A second voltage detection section corresponds to the voltage detection circuit 24C connected to both the ends of the capacitors C1 and C2 connected in series.

Each of the voltage detection circuit 24A, the voltage detection circuit 24B and the voltage detection circuit 24C is equipped with a differential amplifier and an analogue to digital (AD) conversion unit (not shown), and performs AD conversion of a detection signal of a charged voltage of the capacitors C1 and C2. Each of the voltage detection circuit 24A, the voltage detection circuit 24B and the voltage detection circuit 24C outputs a result of the AD conversion to the microcomputer 25. In particular, the voltage detection circuit 24A and the voltage detection circuit 24B amplify the charged voltage of each of the capacitors C1 and C2 by a predetermined amplification rate (a first amplification rate) and output the amplified voltages. On the other hand, the voltage detection circuit 24C amplifies the charged voltage of each of the capacitors C1 and C2 by a predetermined amplification rate (a second amplification rate, which is different from the first amplification rate) and output the amplified voltages.

The microcomputer 25 is comprised of a central processing unit (CPU), and a memory section, etc. The microcomputer 25 switches the connection and disconnection of the detection line switching section 21 and the sampling switch section 23. In other words, the microcomputer 25 turns on (to provide a connection state) and turns off (to provide a disconnection state) one or more of the switches in the detection line switching section 21 and the switches SWA, SWB and SWC in the sampling switch section 23. The microcomputer 25 performs a charging process of charging the capacitor circuit 22 in a state in which the battery cell 1 is electrically disconnected to the voltage detection section 24 by switching the connection and disconnection of the detection line switching section 21 and the sampling switch section 23. Further, the microcomputer 25 performs a battery voltage calculation process of calculating a voltage of each of the unit cells V1 to V9 on the basis of the charged voltage of the capacitors C1 and C2.

In more detail, when performing the charging process of charging each of the capacitors C1 and C2, the microcomputer 25 performs the disconnection of each of the switches SWA, SWB and SWC in the sampling switch section 23 in order to provide the electrical disconnection state between the battery pack 1 and the voltage detection section 24. In this condition, the microcomputer 25 turns ON at least respective two switches belonging to the first switch and the second switch in the detection line switching section 21, in order to connect at least one of the unit cells V1 to V9 to at least one of the capacitors C1 and C2.

That is, the microcomputer 25 provides the connection state of the [4n−1]-th switch and the connection state of the [2n]-the switch in the switches SWm, i.e. turns on the [4n−1]-th switch and the [2n]-th switch in order to connect the unit cells to the capacitor C1. Further, the microcomputer 25 provides the connection state of the [4n−3]-th switch and the connection state of the [2n]-th switch, i.e. turns on the [4n−3]-th switch and the [2n]-th switch in the switches SWm in order to connect the unit cells to the capacitor C2. Still further, the microcomputer 25 provides the connection state of the [4n−1]-th switch and the connection state of the [4n−3]-the switch in the switches SWm in order to connect the two unit cells between the switches in the connection state to the capacitors C1 and C2.

The voltage monitoring device 2 according to the exemplary embodiment performs the first process of switching the connection state and disconnection state of the switches SWm in the detection line switching section 21 and charging each of the capacitors C1 and C2 with the voltage of the unit cells V1 to V9. Further, the voltage monitoring device 2 according to the exemplary embodiment performs the second process of charging each of the capacitors C1 and C2 with the voltage of the unit cells V1 to V9 simultaneously.

In more detail, the first process turns on the [2n]-th switch, and at least one of or both the [4n−1]-th switch and the [4n−3]-th switch in order to provide one of or both:

a closed circuit in which a charging current flows from one of the unit cells V1, V2, V7 to V9 to the capacitor C1 through the connection terminal n1 and the connection terminal N2; and a closed circuit in which a charging current flows from one of the unit cells V1, V2 and V7 to V9 to the capacitor C2 through the connection terminal N3 and the connection terminal N3. Thus, the first process charges the capacitors C1 and C2, independently with a voltage of each of the unit cells.

When the microcomputer 25 turns on both the [4n−1]-th switch and the [4n−3]-th switch and performs the first process, because a current flows in the same direction in each of the two closed circuit previously described, the capacitors C1 and C2 are charged with the same polarity.

After the completion of the first process of charging the capacitor circuit 22, the microcomputer 25 disconnects the detection line switching section 21 from the battery pack 1 and the capacitor circuit 22 to generate the disconnection state between the battery pack 1 and the capacitor circuit 22, i.e. the battery pack 1 is electrically disconnected from the capacitor circuit 22. In the disconnection state between the battery pack 1 and the capacitor circuit 22, the microcomputer 25 instructs one of the switches SWA, SWB and SWC, in the sampling switch section 23 connected to the charged capacitors C1 and C2, to turn ON in order to connect the voltage detection section 24 to the capacitor circuit 22. The voltage detection circuits 24A and 24B (or the voltage detection circuit 24C) corresponding to the capacitors C1 and C2, to which the charging process has been completed, output detection signals to the microcomputer 25.

In the second process, the microcomputer 25 performs the charging process of charging the capacitors C1 and C2 simultaneously with a voltage of a pair of the unit cells V3 and V4 and a voltage of a pair of the unit cells V5 and V6. In more detail, in the second process, the microcomputer 25 turns on the connection state of the [4n−1]-th switch and the [4n−3]-th switch to provide a closed circuit in which a current flows into the capacitors C1 and C2 through the connection terminals N1 and N3 and charges the capacitors C1 and C2 simultaneously.

When the second process performs the charging process, because the connection terminal N2 is open, i.e. not connected to any switch, the capacitors C1 and C2 are not charged through the connection terminal N2. After the completion of the charging process, like the first process, the second process disconnects the detection line switching section 21 from the battery pack 1 and the capacitor circuit 22 to generate the disconnection state between the battery pack 1 and the capacitor circuit 22. That is, the battery pack 1 is electrically disconnected from the capacitor circuit 22. In this state, the voltage detection circuit 24C outputs a detection signal to the microcomputer 25.

The microcomputer 25 in the voltage monitoring device 2 according to the exemplary embodiment performs a battery voltage calculation process, a line disconnection judgment process and a detection system abnormality judgment process. The battery voltage calculation process calculates a voltage (or a battery voltage) of each of the unit cells V1 to V9. The line disconnection judgment process judges occurrence of a line disconnection of detection lines (as electrical passages) from the battery pack 1 to the capacitor circuit 22. The detection system abnormality judgment process judges occurrence of abnormality of the voltage detection system. The microcomputer 25 performs these processes on the basis of the detection results of each of the detection results of each of the voltage detection circuits 24A, 24B and 24C after the first process and the second process have performed the charging process of the capacitors C1 and C2.

The battery voltage calculation process performs selectively the first process and the second process in order to charge the capacitors C1 and C2. When the first process charges one of the capacitors C1 and C2 or the overall capacitors C1 and C2, the battery voltage calculation process calculates one of the unit cells V1, V2 and V7 to V9 used for charging the capacitors C1 and C2 on the basis of the detection results of one of or both the voltage detection circuits 24A and 24B. Further, when the second process charges both the capacitors C1 and C2 simultaneously, the battery voltage calculation process calculates one of the unit cells V3, V4, V5 and V6 used for charging the capacitors C1 and C2 on the basis of the detection result of the voltage detection circuit 24C.

The line disconnection judgment process performs the charging of the capacitor so that a voltage of the capacitor after the charging has a polarity which is inverse to the polarity of a voltage of the capacitor before the charging. The microcomputer 25 performs the line disconnection judgment process to judge occurrence of a line disconnection of a detection line (as an electrical passage) on the basis of the polarity of the capacitor after the charging. In this case, when the polarity of the voltage of the capacitor after the charging is inverse to the polarity of the voltage of the capacitor before the charging, the line disconnection judgment process judges that no line disconnection of the electrical passage has occurred. On the other hand, when the polarity of the voltage of the capacitor after the charging is not inverse to the polarity of the voltage of the capacitor before the charging, the line disconnection judgment process judges that a line disconnection of the electrical passage has occurred. The first process and the second process perform the charging process of the capacitor, i.e. charge the capacitor in the line disconnection judgment process.

The microcomputer 25 performs the detection system abnormality judgment process after the first process or the second process has completed the charging of the capacitors C1 and C2. In this case, the microcomputer 25 compares an addition value of the charged voltage of the capacitor C1 and the charged voltage of the capacitor C2 detected by the voltage detection circuits 24A and 24B with the detection value of the charged voltage (total voltage) of the capacitors C1 and C2 detected by the voltage detection circuit 24C. The microcomputer 25 judges occurrence of a detection system abnormality on the basis of the comparison result, i.e. whether or not the addition value of the charged voltage of the capacitor C1 and the charged voltage of the capacitor C2 is equal to the detection value of the total voltage of the capacitors C1 and C2.

When the comparison result indicates that the addition value of the charged voltage of the capacitor C1 and the charged voltage of the capacitor C2 is equal to the detection value of the total voltage of the capacitors C1 and C2, the microcomputer 25 judges no abnormality occurs. On the other hand, when these values are different to each other, the microcomputer 25 judges occurrence of the abnormality in the voltage detection section 24.

The microcomputer 25 in the voltage monitoring device 2 according to the exemplary embodiment performs the battery voltage calculation process, the line disconnection judgment process and the detection system abnormality judgment process in the predetermined order stored in the memory section. For example, the predetermined order for processing these processes has been determined to reduce the frequency of switching operations of the switches. The microcomputer 25 performs these processes on the basis of the predetermined order stored in the memory section.

The microcomputer 25 performs the battery voltage calculation process for each of the battery cells multiple times.

The microcomputer 25 performs the line disconnection judgment process for each of the detection lines (as the electric passages) multiple times The microcomputer 25 performs the line disconnection judgment process during the battery voltage calculation process multiple times in consideration of improving the detection efficiency of the charged voltage of each of the capacitors C1 and C2.

By the way, in the structure of the voltage monitoring device according to the exemplary embodiment in which the voltage detection circuit 24C is arranged and commonly used by both the capacitors C1 and C2 adjacent to each other shown in FIG. 1, this makes it possible to remove some of the [2n]-th switches connected to the connection terminal N2. This causes a possible variation of the charged voltages of the capacitors C1 and C2 after the microcomputer 25 performs the second process dues to the charged state of the capacitor circuit 22.

As shown in FIG. 1, when the microcomputer 25 performs the first process, in order to calculate a battery voltage, to charge the capacitor C1 with the voltage of the unit cell V7 and the capacitor C2 with the voltage of the unit cell V9 through the switches SW7 to SW9, the charged voltage of the capacitor C1 and the charged voltage of the capacitor C2 have the same polarity. In this condition, when the microcomputer 25 performs the line disconnection judgment process after the battery voltage detection process, the capacitor C1 is connected to the unit cell V9 by turning on the switches SW9 and SW10 so that the polarity of the charged voltage of the capacitor C1 is reverse to the polarity of the voltage of the unit cell V9. That is, the microcomputer 25 performs the charging process (the first process) in this state.

In this case, the polarity of the charged voltage of the capacitor C1 becomes inverse so long as no line disconnection of the charging passage of the capacitor C1 through the unit cell V9 occurs. As a result, the capacitors C1 and C2 have the different polarities. As shown in FIG. 1, the connection terminal N1 of the capacitor C1 has a negative polarity (−), the connection terminal N2 of the capacitor C1 has a positive polarity (+), the connection terminal N3 of the capacitor C2 has a negative polarity (−), and the connection terminal N2 of the capacitor C2 has the positive polarity (+).

When the capacitors adjacent to each other have the different polarities, the execution of the second process by the microcomputer 25 generates a possible variation of the charged voltages of the capacitors C1 and C2. That is, as shown in FIG. 1, when the microcomputer 25 performs the second process by using the voltage of the unit cells V3 and V4 through the switches SW3 and SW5, the charged voltage of the capacitor C1 increases because of having the polarity of the voltage of the unit cells V3 and V4 (i.e. the charged voltage of the capacitor C1 becomes twice of the voltage of the unit cell). On the other hand, the charged voltage of the capacitor C2 decreases (for example, to zero volt) because the charged voltage of the capacitor C2 is different from the polarity of the voltage of the unit cells V3 and V4.

That is, when the charged voltages of the capacitors C1 and C2 have different polarities, the second process performed by the microcomputer 25 has a possible case of increasing the charged voltage of each of the capacitors C1 and C2 more than the withstand voltage thereof. It would therefore be necessary for each of the capacitors C1 and C2 to have the withstand voltage more than a voltage of the unit cell in order to avoid this possible case. This would increase an overall size of the monitoring system equipped with the voltage monitoring device and a manufacturing cost of the overall monitoring system having the voltage monitoring device.

In order to avoid this problem, the microcomputer 25 as the voltage monitoring device judges whether or not the charged voltage of the capacitor C1 and the charged voltage of the capacitor C2 have the same polarity on the basis of the detection result of the charged voltage of the capacitor circuit 22 obtained by the voltage detection circuit 24 before performing the second process.

When the judgment result indicates that the charged voltages of the capacitors C1 and C2 have the different polarities to each other, the microcomputer 25 performs the polarity switching process of switching a polarity of the charged voltage before performing the second process.

In this charged voltage polarity switching process, the microcomputer 25 turns on one of the [2n]-th switches (n=1, 4, 5), and charges at least one of the capacitors C1 and C2.

The microcomputer 25 in the voltage monitoring device 2 according to the exemplary embodiment performs the polarity switching process by performing the first process (the individual capacitor charging process of charging each of the capacitors). That is, the microcomputer 25 performs the first process in order to perform one of the battery voltage calculation process, the line disconnection judgment process and the detection system abnormality judgment process because the capacitors are charged by the first process during each of the battery voltage calculation process, the line disconnection judgment process and the detection system abnormality judgment process. At this time, when there is a remaining unit cell, for which the battery voltage calculation process has not been performed, and a remaining detection line (as an electric passage), for which the line disconnection judgment process has not been performed, the microcomputer 25 performs the polarity switching process by using the non-performed processes (as the first process regarding the non-performed processes).

In this case, it is possible for the microcomputer 25 to generate the condition in which the capacitors C1 and C2 have the same polarity without performing any additional process by changing the processing order of performing these processes only.

A description will now be given of an example of performing the polarity switching process by performing the detection system abnormality judgment process.

FIG. 2 is a view showing a flow chart of the process performed by the microcomputer 25 in the voltage monitoring device 2 according to the exemplary embodiment shown in FIG. 1.

The microcomputer 25 repeatedly performs the process shown in FIG. 2 every time when the voltage monitoring device 2 performs the voltage monitoring of the battery pack 1.

In step S10, the microcomputer 25 judges whether or not the next process to be performed is the second process.

When the judgment result indicates negation ("NO" in step S10), the microcomputer 25 finishes the processes shown in FIG. 2.

On the other hand, when the judgment result indicates affirmation ("YES" in step S10), i.e. indicates that the next process to be performed is the second process, the operation flow goes to step S11.

In step S11, the microcomputer 25 detects whether or not the charged voltages of the capacitors C1 and C2 which are arranged adjacent to each other have the same polarity.

When the detection result in step S11 indicates negation "NO" in step S11), i.e. indicates that the charged voltages of the adjacent capacitors C1 and C2 have the same polarity, the operation flow goes to step S12.

In step S12, the microcomputer 25 performs the polarity switching process before performing the second process.

In the structure of the voltage monitoring device 2 according to the exemplary embodiment, the microcomputer 25 turns on one of the [2n]-th switch connected to the connection terminal N2 in order to perform the detection system abnormality judgment process. Further, the microcomputer 25 performs the individual charging process of charging each of the capacitors C1 and C2 by using the unit cells connected to the [2n]-th switch. This makes it possible for the charged voltage of the capacitor C1 and the charged voltage of the capacitor C2 to have the same polarity.

On the other hand, when the detection result in step S11 indicates affirmation ("YES" in step S11), the microcomputer 25 finishes the process shown in FIG. 2. That is, the microcomputer 25 does not perform the polarity switching process when the detection result in step S11 indicates affirmation ("YES" in step S11).

Next, a description will now be given of the example of the voltage monitoring device according to the exemplary embodiment with reference to FIG. 3A to FIG. 3D.

FIG. 3A to FIG. 3D are views showing the process shown in FIG. 2 performed by the voltage monitoring device 2 according to the exemplary embodiment. There is no occurrence of abnormality such as line disconnection of each of the detection lines L1 to L9 in the following explanation.

The sampling switch section 23, the voltage detection section 24 and the microcomputer 25 are omitted from FIG. 3 for brevity.

Figure 3A:
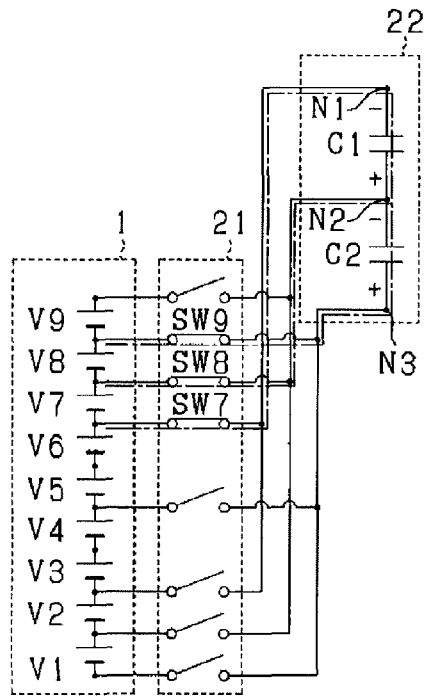
FIG. 3A to FIG. 3D are views showing the process shown in FIG. 2 performed by the voltage monitoring device according to the exemplary embodiment of the present invention.

As shown in FIG. 3A, the microcomputer 25 performs the first process (the individual capacitor charging process) in order to calculate a battery voltage. That is, the microcomputer 25 turns on the switches SW7 to SW9 in order for the voltage of the unit cell V7 to charge the capacitor C1 and for the voltage of the unit cell V8 to charge the capacitor C2. After the completion of the charging process, the voltage detection circuit 24A detects a charged voltage of the capacitor C1 and voltage detection circuit 24B detects a charged voltage of the capacitor C2. In this case, the voltage of the capacitor C1 and the voltage of the capacitor C2 have the same polarity.

Figure 3B:
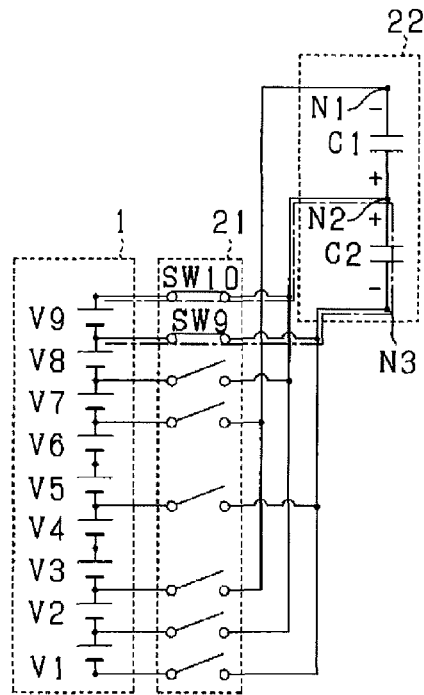

Next, as shown in FIG. 3B, the microcomputer 25 performs the line disconnection judgment process, i.e. turns on the switches SW9 and SW10 to connect the capacitor C9 to the unit cell V9 so that the charged voltage of the capacitor C9 and the voltage of the unit cell V9 have different polarities to be reverse to each other. At this time, the polarity of the charged voltage of the capacitor C9 becomes inverted by the voltage of the unit cell V9. That is, the charged voltage of the capacitor C2 has a polarity which is reverse to the polarity of the charged voltage of the capacitor C1. After the completion of the charging process, the microcomputer 25 judges no occurrence of the line disconnection when the polarity change of the charged voltage of the capacitor C2, detected by the voltage detection circuit 24B, is recognized.

Next, the microcomputer 25 performs the charging process of charging the capacitors C1 and C2 simultaneously. When judging that the charged voltage of the capacitor C1 and the charged voltage of the capacitor C1 have different polarities, the microcomputer 25 performs the first process (the individual capacitor charging process) in order to judge occurrence of the detection system abnormality as the polarity switching process.

Figure 3C:
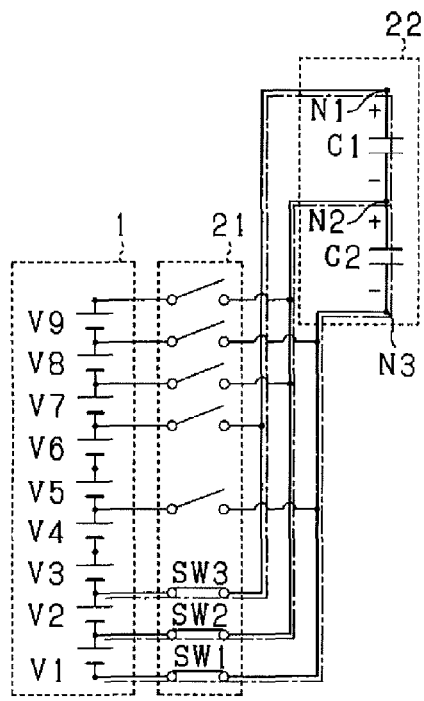

As shown in FIG. 3C, the microcomputer 25 turns on the switches SW1, SW2 and SW3 in order to charge the capacitor C1 by the voltage of the unit cell V1 and the capacitor C2 by the voltage of the unit cell V2 so that the charged voltages of the capacitors C1 and C2 adjacent to each other have the same polarity. Further, the microcomputer 25 judges occurrence of the abnormality of the detection line on the basis of each of the charged voltage of the capacitors C1 and C2 detected by the voltage detection circuits 24A, 24B and 24C.

Figure 3D:
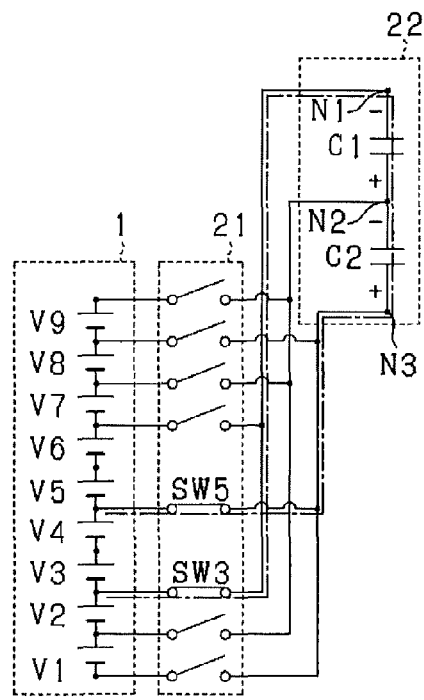

The microcomputer 25 performs the polarity switching process after the capacitors C1 and C2 adjacent to each other have the same polarity of the charged voltage by the polarity switching process. At this time, as shown in FIG. 3C, the capacitors C1 and C2 adjacent to each other have the same polarity of the charged voltage. Accordingly, as shown in FIG. 3D, when the microcomputer 25 turns on the switches SW3 and SW5, and then performs the second process, it is possible for the voltage detection circuits 24A, 24B and 24C to correctly detect each of the charged voltage of the capacitors C1 and C2, without causing voltage variation, which correspond to the voltage of the unit cells V3 and V4.

As previously described in detail, the voltage monitoring device according to the exemplary embodiment has the following excellent effects.

When a plurality of the capacitors has the charged voltages of different polarities, the microcomputer 25, i.e. the voltage monitoring device performs the polarity switching process before performing the second process (simultaneous charging) in order for these capacitors to have the same polarity of the charged voltage. This makes it possible to perform the second process when the capacitors have the same polarity of the charged voltage, and avoid incorrect detection results due to variation between the charged voltages of the capacitors.

The microcomputer 25 performs the first process as the polarity switching process before the second process. In this case, the first process is one of the predetermined processes as the voltage monitoring process, and the microcomputer 25 uses this first process as the polarity switching process. It is therefore for the voltage monitoring device 2 according to the exemplary embodiment to correctly switch a polarity of the charged voltage of the capacitor which is one of the capacitors without introducing additional process. This makes it possible for the capacitors adjacent to each other to have the same polarity of the charged voltage.

When there is a remaining unit cell, for which the first process has not processed, the microcomputer 25 performs the first process as the polarity switching process for the remaining unit cell. In this case, the microcomputer 25 performs the first process as the polarity switching process for the remaining unit cell with high priority. This makes it possible for the microcomputer 25 to correctly perform each of the processes with optimal processing order.

The microcomputer 25 performs the first process (the individual capacitor charging process) as the polarity switching process in order to detect the detection line abnormality judgment process. This makes it possible to provide the state in which the capacitors adjacent to each other have the same polarity of the charged voltage by using the charging process for the detection line abnormality judgment without performing any additional process.

The microcomputer 25 does not perform the polarity switching process of the capacitors adjacent to each other when these capacitors have the same polarity of the charged voltage. In this case, it is possible for the microcomputer 25 to perform the optimized processing order of each of the processes.

The monitoring system shown in FIG. 1 has the structure in which the number of the [2n]-th switches as the second switches is less than the number of the [4n−1]-th switches and the [4n−3]-th switches as the first switches. This structure makes it possible to reduce the number of the switches connected to the electrode terminals T1 to T10.

It is possible for the voltage monitoring device 2 according to the exemplary embodiment to have the following modifications. The same components between the exemplary embodiment and the following modifications will be referred to the same reference numbers and characters.

The exemplary embodiment previously described shows for the microcomputer 25 to perform the first process, as the polarity switching process, in order to perform the detection line abnormality judgment. However the concept of the present invention is not limited by this exemplary embodiment. It is possible for the microcomputer 25 to perform the first process, as the polarity switching process, in order to perform the battery voltage calculation or the line disconnection judgment.

When performing the first process, as the individual capacitor charging process, for performing either the voltage calculation or the line disconnection judgment, it is possible for the capacitors adjacent to each other to have the charged voltage of the same polarity by using the charging process necessary for the battery voltage calculation and the line disconnection judgment without adding new process.

When the step S11 shown in FIG. 2 judges affirmation ("YES" in step S11), i.e. indicates that the capacitors C1 and C2 have the same polarity of the charged voltage, it is possible for the microcomputer 25 to perform the second process regardless of the processing order. When the microcomputer 25 performs the second process preferentially, it is possible to optimize the processing order performed by the microcomputer 25.

It is acceptable for the microcomputer 25 to judge whether or not the capacitors adjacent to each other have the same polarity of the charged voltage on the basis the previous detection results or a continuous processing order instead of using the detection result of the voltage detection section 24. In this case, the microcomputer 25 judges whether or not a continuous processing is correctly performed immediately before the second process (the simultaneous charging) is performed, where the continuous processing includes the process for the capacitors C1 and C2 to have the same polarity of the charged voltage and the process of inverting the polarity of the charged voltage of one of these capacitors.

The microcomputer 25 performs the polarity switching process when the judgment result indicates affirmation, i.e. indicates that the continuous processing is correctly performed immediately before the second process (the simultaneous charging) is performed.

The exemplary embodiment shows the voltage monitoring device 2 of a double flying capacitor type using the two capacitors C1 and C2 connected in series. However, the concept of the present invention is not limited by this exemplary embodiment. For example, it is possible for the voltage monitoring device to perform the polarity switching process when using not less than three capacitors connected in series. In this case, it is possible for the voltage monitoring device for the capacitors adjacent to each other in not less than three capacitors to have the same polarity of the charged voltage by performing the same process shown in FIG. 3A to FIG. 3D.

It is acceptable for the microcomputer 25 to perform an additional process as the polarity switching process.

It is acceptable to select a high priority process in order to perform the polarity switching process. For example, when the processing priority order indicates that a relationship of the battery voltage calculation process>the line disconnection judgment process>the detection system abnormality judgment process, the microcomputer 25 performs, as the polarity switching process, the process having a high priority processing when this process has not been performed. This allows the microcomputer 25 to perform the polarity switching process by considering the processing priority of these processes.

The exemplary embodiment previously described shows the example of using the single connection node N2 between the pair of the capacitors. However, the present invention is not limited by this exemplary embodiment. It is acceptable to have not less than two connection terminals N2 between the capacitors of not more than two. This structure makes it possible remove the switches connected to the connection terminals N2.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalents thereof.

What is claimed is:

1. A voltage monitoring device capable of monitoring a voltage of each of unit cells forming a battery pack based on detection results of first voltage detection sections and a second voltage detection section, comprising:
   a capacitor circuit comprising a plurality of capacitors connected in series;
   plurality of first unit cells among the unit cells, the plurality of first unit cells each having an electrode terminal of a first polarity;
   a plurality of second unit cells among the unit cells, the plurality of second unit cells not including any of the unit cells in the plurality of first unit cells, the plurality of second unit cells each having an electrode terminal of the first polarity;
   a plurality of first switches through which the electrode terminals of the first polarity of the plurality of first unit cells are connected to both end terminals of the capacitor circuit;
   a plurality of second switches through which the electrode terminals of the first polarity of the plurality of second unit cells are connected to a connection node between the capacitors connected in series in the capacitor circuit;
   the first voltage detection sections, each of which corresponds to each of the capacitors connected in series;
   the second voltage detection section connected to the end terminals of the capacitor circuit;
   a charging control section capable of executing a first process and a second process, the first process for individually charging each of the capacitors through the plurality of first switches and the plurality of second switches, and the second process for connecting the plurality of first switches to the capacitors, and for disconnecting the plurality of second switches from the capacitors so as to charge the capacitors simultaneously; and
   a polarity switching section capable of executing a polarity switching process by using polarity switches through which the end terminals and the connection node in the capacitor circuit are connected to the first voltage detection sections and the second voltage detection section so as to allow the capacitors arranged adjacent to each other to have a same polarity of a charged voltage before performing the second process, when the capacitors have a different polarity.

2. The voltage monitoring device according to claim 1, wherein the polarity switching section executes the first process as the polarity switching process so that the capacitors arranged adjacent to each other have the same polarity of the charged voltage.

3. The voltage monitoring device according to claim 2, wherein
   the charging control section executes the first process as a capacitor charging process in order to calculate a battery voltage of each of the unit cells based on detection results of the battery voltage detection sections, and executes the first process as the capacitor charging process in order to detect occurrence of a line disconnection of connection lines between the battery pack and the capacitor circuit based on the polarity of the capacitors after charging, and
   the polarity switching section executes the first process as the polarity switching process in order to calculate the battery voltage of each of the unit cells based on the detection results of the battery voltage detection sections, or executes the first process in order to detect occurrence of the line disconnection of the connection lines between the battery pack and the capacitor circuit based on the polarity of the capacitors after the charging.

4. The voltage monitoring device according to claim 3, wherein when there is a remaining unit cell, a battery voltage of which has not been processed, and a remaining detection line, the line disconnection of which has not been judged, the polarity switching section executes the first process as the polarity switching process for the remaining unit cell and the remaining detection line.

5. The voltage monitoring device according to claim 2, wherein
   the charging control section executes the first process as the capacitor charging process in order to detect whether a detection line abnormality occurs, and
   the polarity switching section executes the first process as the polarity switching process in order to detect whether the detection line abnormality occurs, wherein the detection of the detection line abnormality detects occurrence of abnormality of each of the first voltage detection sections and the second voltage detection section based on whether an addition value of the charged voltage of each of the capacitors detected by the first voltage detection sections is equal to a total voltage of the capacitors detected by the second voltage detection section.

6. The voltage monitoring device according to claim 5, wherein when the detection of occurrence of the detection line abnormality has not been executed, the polarity switching section executes the first process as the polarity switching process in order to detect the occurrence of the detection line abnormality.

7. The voltage monitoring device according to claim 1, wherein the polarity switching section does not execute the polarity switching process of the capacitors arranged adjacent to each other when the capacitors arranged adjacent to each other have a same polarity of the charged voltage.

8. The voltage monitoring device according to claim 1, further comprising a voltage polarity judgment section capable of detecting whether the capacitors arranged adjacent to each other have a charged voltage of a same polarity based on the detection results of the first voltage detection sections and the second voltage detection section.

9. The voltage monitoring device according to claim 1, wherein a number of the plurality of second switches is smaller than a number of the plurality of first switches.

* * * * *